United States Patent [19]
Witanachchi et al.

[11] Patent Number: 5,660,746
[45] Date of Patent: Aug. 26, 1997

[54] DUAL-LASER PROCESS FOR FILM DEPOSITION

[75] Inventors: Sarath Witanachchi; Pritish Mukherjee, both of Tampa, Fla.

[73] Assignee: University of South Florida, Tampa, Fla.

[21] Appl. No.: 328,242

[22] Filed: Oct. 24, 1994

[51] Int. Cl.⁶ .................................................. B23K 26/00
[52] U.S. Cl. ................. 219/121.66; 219/121.69; 219/121.76; 427/596
[58] Field of Search ................ 219/121.68, 121.69, 219/121.76, 121.77, 121.85, 121.66; 427/554, 555, 556, 596, 597; 505/474, 480

[56] References Cited

U.S. PATENT DOCUMENTS

| | | | |
|---|---|---|---|
| 4,414,059 | 11/1983 | Plum et al. | |
| 4,728,389 | 3/1988 | Logar. | |
| 4,874,741 | 10/1989 | Shaw et al. | |
| 4,925,523 | 5/1990 | Braren et al. | |
| 4,970,196 | 11/1990 | Kim et al. | |
| 5,019,552 | 5/1991 | Balooch et al. | |
| 5,028,584 | 7/1991 | Schultheiss et al. | |
| 5,049,405 | 9/1991 | Cheung | |
| 5,124,310 | 6/1992 | Ovshinsky et al. | |
| 5,168,097 | 12/1992 | Araya et al. | |
| 5,192,580 | 3/1993 | Blanchet-Fincher | 427/596 |
| 5,194,713 | 3/1993 | Egitto et al. | |
| 5,227,608 | 7/1993 | Yoshida et al. | 219/121.76 |
| 5,231,075 | 7/1993 | Nagaishi et al. | |
| 5,248,659 | 9/1993 | Nagaishi et al. | |
| 5,248,662 | 9/1993 | Yoshida et al. | |
| 5,288,528 | 2/1994 | Blanchet-Fincher | 427/596 |
| 5,290,761 | 3/1994 | Keating et al. | |
| 5,300,485 | 4/1994 | Yoshida et al. | |
| 5,366,556 | 11/1994 | Prince et al. | 118/722 |
| 5,395,663 | 3/1995 | Tabata et al. | 427/554 |
| 5,558,788 | 9/1996 | Mashburn | 219/121.68 |

FOREIGN PATENT DOCUMENTS

| | | |
|---|---|---|
| 4-214098 | 8/1992 | Japan. |
| 5-139735 | 6/1993 | Japan. |

OTHER PUBLICATIONS

Al–Dhahir et al., "Dual Excimer and $CO_2$ Laser Etching Studies of Polyethylene Terephthalate", Applied Physics B, vol. 49, pp. 435–440, 1989.

Deposition angle–dependent morphology of laser deposited $YBa_2Cu_3O_7$ thin films; Soon–Gul Lee, Doo–Sup Hwang, Yong Ki Park, and Jong–Chul Park; Korea Research Institute of Standards and Science, P.O. Box 102, Yusong, Taejon 305–600, Republic of Korea; pp. 764–766.

Off–axis laser deposition of $YBa_2Cu_3O_{7-\delta}$ thin films, B. Holzapfel, B. Roas and L. Schulz P. Bauer and G. Saemann–Ischenko, pp. 3178–3180.

Primary Examiner—Teresa J. Walberg
Assistant Examiner—Gregory L. Mills
Attorney, Agent, or Firm—Calfee, Halter & Griswold

[57] ABSTRACT

The present invention provides a dual-laser deposition process for thin film deposition. Specifically, the present invention provides a method of laser deposition for the growth of in-situ particulate free films. The preferred embodiment includes the spatial overlap on a target of two laser pulses of different wavelengths such that the ejection of the particulates and its subsequent deposition on a substrate during film growth is controlled and essentially eliminated by a suitable temporal delay between the two laser pulses. The present invention enhances the species kinetic energy in the laser-ablated plume via enhanced plume excitation. This allows the reduction of substrate temperature for epitaxial film growth as a result of the increased species mobility on the substrate due to enhanced plume excitation. Also, the ionization in the plume is enhanced. This is important both for enhanced gas phase reactions and for oriented film growth, leading to epitaxy, on the substrate. Moreover, the present invention is designed to enlarge the spatial lateral extent of the plume to enhance the area of uniform thin film deposition on the substrate.

24 Claims, 3 Drawing Sheets

OTHER PUBLICATIONS

Smooth $YBA_2CU_3O_{7-x}$ thin films prepared by pulse laser deposition in $O_2/Ar$ atmosphere; A. Khule, J.L. Skov, S. Hjorth, Rasmussen, and J. Bindslev Hansen, Physics Department, Technical University of Denmark, DK–2800 Lyngby, Denmark, pp. 3178–3180.

Origin of surface roughness for c–axis oriented Y–Ba–Cu–O superconducting films, C.C. Chang, X.D.Wu, R. Ramesh, X.X.Xi, T.S. Ravi, T. Venkatesan, D.M. Hwang, R.E. Muenchausen, S. Foltin, and N.S. Nogar, Bellcore, Red Bank, New Jersey 07701, pp. 1814–1816.

DUAL-LASER PROCESS FOR FILM DEPOSITION

GOVERNMENT SUPPORT

The present invention was partially supported by National Science Foundation Grant Numbers DDM-9210326 and ECE-9309498. The United States Government may have rights in the invention.

TECHNICAL FIELD

This invention relates, in general, to a process for film deposition using two lasers and, in particular, to the deposition of substantially particulate-free films deposited from a high energy laser-ablated plume.

BACKGROUND OF THE PRESENT INVENTION

Pulsed laser deposition is a known technique for the deposition of thin films of a material on a substrate. This process is widely published and is described in U.S. Pat. No. 4,701,592 entitled, "Laser Assisted Deposition and Annealing". The advantages of pulsed laser deposition for the deposition of multicomponent materials from a single composite target while maintaining its stoichiometry is also well known. This advantage of congruent evaporation has been discussed in the literature (see e.g., G. K. Hubler, MRS Bulletin, p. 26–27, February 1992 and J. T. Cheung and H. Sankur, CRC Critical Reviews in Solid State and Materials Sciences 15, p. 63–109). Other advantages include the ability to incorporate reactive species into the growing film by the presence of a suitable ambient gas in the deposition chamber (see e.g., G. K. Hubler, MRS Bulletin, p. 26–27, February 1992 and J. T. Cheung and H. Sankur, CRC Critical Reviews in Solid State and Materials Sciences 15, p. 63–109) and precise control of the deposition rate by controlling the fluence and repetition rate of the ablating pulses (see e.g., J. Cheung and J. Horwitz, MRS Bulletin, p. 30–36, February 1992). A desirable element of uv laser ablated film growth is the production of high energy plume species leading to the capability of growing epitaxial films on a low temperature substrate (see e.g., G. K. Hubler, MRS Bulletin, p. 26–27, February 1992; J. Cheung and J. Horwitz, MRS Bulletin, p. 30–36, February 1992; and S-G. Lee, D-S. Hwang, Y. K. Park and J-C. Park, Appl. Phys. Lett. 65 (6), p. 764–766, 1994).

The principal barrier to the use of pulsed laser deposition in the growth of defect free films is the inherent problem of "splashing" which causes the deposition of particulates in the growing film. This problem has been widely recognized and the detrimental effects of splashing on the quality of the deposited film has been pointed out (see J. T. Cheung and H. Sankur, CRC Critical Reviews in Solid State and Materials Sciences 15, p. 63–109). These particulates are generally undesirable for multilayer structures and fine line patterning for electronic applications (see S-G. Lee, D-S. Hwang, Y. K. Park and J-C. Park, Appl. Phys. Lett. 65 (6), p. 764–766, 1994, and A. Kuhle, J. L. Skov, S. Hjorth, I. Rasmussen and J. B. Hansen, Appl. Phys. Lett. 64 (23), p. 3178–3180, 1994). The optical losses produced by these particulates is of specific concern in optical films for waveguide lasers and optical couplers where even the presence of submicron particulates leads to an unacceptable scattering mechanism. As will be apparent in the following, the present invention is directed to a novel dual-laser process that substantially eliminates particulates in the deposited film.

In the literature, the ejection of microscopic particulates from the target during pulsed laser deposition stems primarily from two sources. These are the (>1 μm) particles that result from microcracks, pits and loosely attached particles on the target surface and the smaller submicron particles resulting from the superheating of a subsurface layer leading to explosive evaporation (see J. T. Cheung and H. Sankur, CRC Critical Reviews in Solid State and Materials Sciences 15, p. 63–109). Various attempts have been made to eliminate such particulates. A gravity dependent mechanical filtering approach has been reported (see J. T. Cheung, Appl. Phys. Lett. 43, 255, 1983) but is applicable only to the larger particles. However, the use of evaporation from a molten surface to prevent the generation of particulates is restricted only to single component targets. It has also been reported that reducing the power of the ablating laser below 150 $mJ/cm^2$ minimizes the splashing (see e.g., S. D. Harkness and R. K. Singh, J. Appl. Phys. 75 (1), p. 669–671, 1994). However, the resultant decrease in plume species energy necessitates the use of higher substrate temperatures for epitaxial film growth, thus negating one of the most important advantages of pulsed laser deposition for in situ epitaxial film growth. An experiment using an excimer laser for heating the plume produced by a 1.06 μm Nd:YAG laser about 2 mm away from the target has been reported to have shown some reduction in particulate deposition but not substantially complete removal (see e.g., G. Koren, R. J. Baseman, A. Gupta, M. I. Lutwyche and R. B. Laibowitz, Appl. Phys. Lett. 56 (21) p. 2144–2146, 1990). However, applicants believe the quality of the deposited films using this approach is inferior to the quality achievable by single excimer laser deposition. More recently, the use of a relatively high pressure inert ambient during single-laser deposition has been reported as indicating the possibility of removing the larger particulates (see A. Kuhle, J. L. Skov, S. Hjorth, I. Rasmussen and J. Bindslev Hansen, Appl. Phys. Lett. 64 (23) p. 3178–3180, 1994). Micron size particles still persist. Moreover, while eliminating some of the particulates the presence of the high pressure ambient drastically reduces the kinetic energy of species in the plume; again requiring elevated substrate temperatures to ensure film quality. Another approach to solving the particulate problem is described in U.S. Pat. No. 5,049,405, which discloses single excimer laser-ablated deposition where the use of simultaneous rotation and translation of the target is designed to ensure that the excimer laser ablates a fresh spot every shot. This process is still limited by the particulates existing in single laser deposition from even a smooth target.

SUMMARY OF THE INVENTION

The present invention provides a dual-laser deposition process that, in its preferred form, substantially reduces the particulates without losing any of the basic advantages that makes pulsed laser deposition appealing for thin film deposition. More specifically, the present invention provides a method of laser deposition for the growth of in-situ particulate free films. The preferred embodiment of the method includes the spatial overlap on a target of two laser pulses of different wave lengths such that the ejection of the particulates and its subsequent deposition on a substrate during film growth is controlled and essentially eliminated by a suitable temporal delay between the two laser pulses.

Additionally, the method of the present invention is preferably designed to enhance the species kinetic energy in the laser-ablated plume via enhanced plume excitation. This allows the reduction of substrate temperature for epitaxial film growth as a result of the increased species mobility on the substrate due to enhanced plume excitation.

Still further, the method of the present invention is preferably designed to enhance the ionization in the plume. Such an enhancement is important both for enhanced gas phase reactions and for oriented film growth, leading to epitaxy, on the substrate.

Moreover, the method of the present invention is preferably designed to enlarge the spatial lateral extent of the plume in order to enhance the area of uniform thin film deposition on the substrate. This feature is important for manufacturing processes requiring large-area uniform films without sacrificing stoichiometric integrity and morphological quality of multicomponent films.

These and other features of the method of the present invention will become further apparent from the following detailed description and the accompanying drawings.

DETAILED DESCRIPTION OF THE PREFERRED EMBODIMENT

Figure 1:
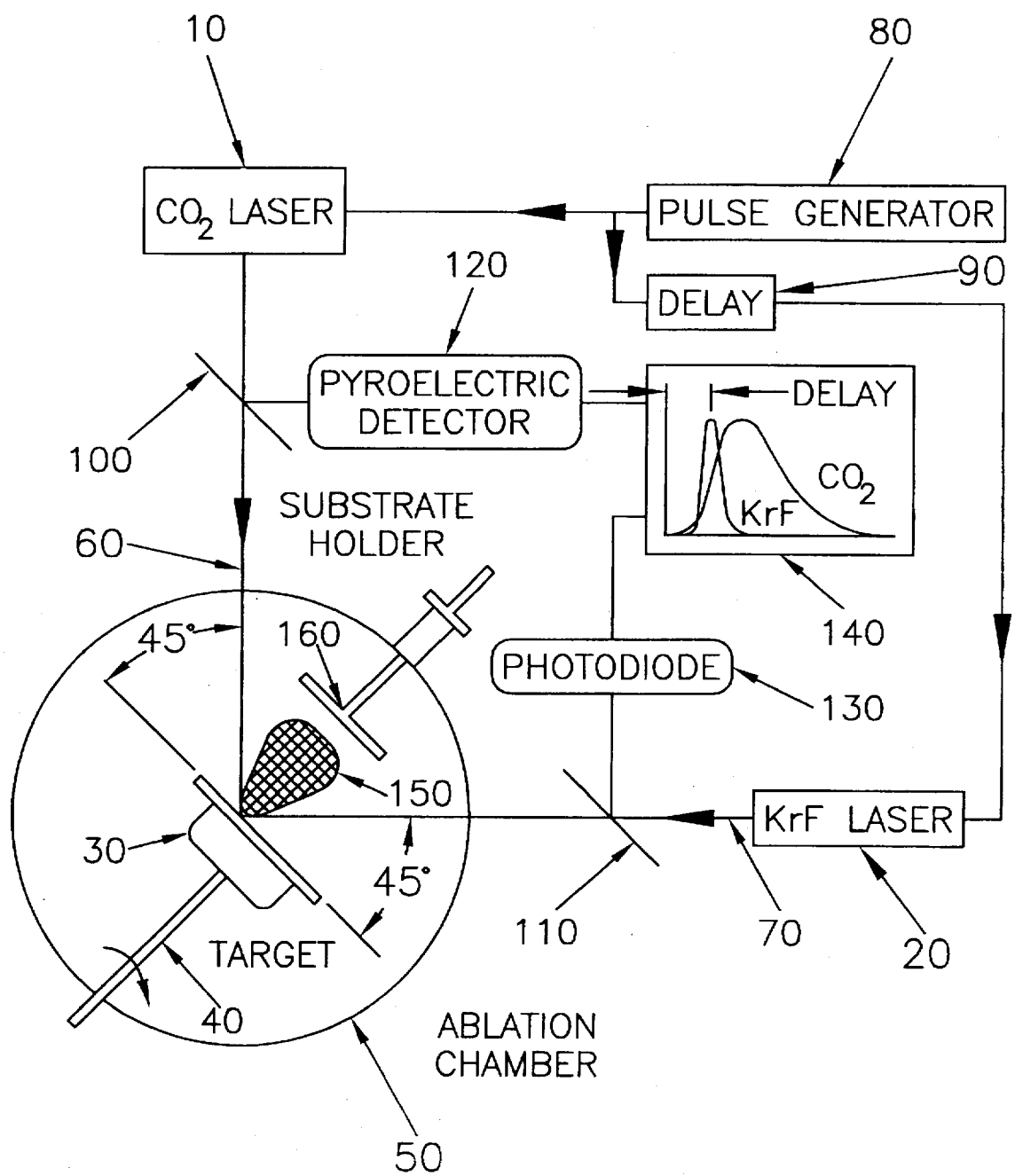
FIG. 1 is a schematic illustration of a system for depositing a thin film onto a substrate, by the method of the present invention.

FIG. 1 depicts the basic components of a system for the dual-laser deposition of uniform films on a substrate with a significantly reduced particulate density, according to the method of the present invention. The system comprises a $CO_2$ pulsed laser (10) which produces the first pulsed laser beam having a 10.6 micrometer wavelength and a pulse duration of 500 ns with a rise time of 125 ns. The system also uses a KrF pulsed laser (20) which produces the second pulsed laser beam having a wavelength of 248 nm and a pulse width of 20 ns.

The ablation target (30) is placed on a rotating turret (40) in a typical vacuum chamber (50). Generally, the target is formed as a circular disk of solid material. The $CO_2$ laser beam (60) and the KrF laser beam (70) are directed through lenses and windows independently into the chamber. The beams are focused onto the target (20) such that they are spatially overlapped at the target. The applicants' concept of the beams being "spatially overlapped at the target" means that the beams are directed at the target in such a way that the respective areas of the target upon which the beams impinge at least partially overlap. The angle of incidence on the target for the $CO_2$ laser beam and the KrF laser beam may be picked to be between zero and 90 degrees to obtain the desired spatial overlap of the two lasers at the target.

The two lasers, the $CO_2$ and KrF lasers are triggered by a pulsed generator (80) and a delay module (90) that is capable of introducing an inter-pulse-delay between the two laser pulses. A small fraction of the two laser beams are diverted using beam splitters (100, 110) placed outside the vacuum chamber onto two independent detectors (120, 130) that are sensitive to the respective wavelengths. The signals from the detectors are fed into a fast oscilloscope (140) that displays the individual temporal pulse profiles. The delay generator was adjusted to produce the required inter-pulse-delay as seen on the oscilloscope. Generally, the inter-pulse-delay is adjusted such that the $CO_2$ laser pulse precedes the KrF laser pulse.

During film growth using the dual-laser process in the controlled ambient of a vacuum chamber the $CO_2$ pulse arrives at the target first and begins to heat up the material within the profile of the laser spot on the target. If the KrF laser pulse arrives at the same spot on the target that has been heated just above the melting point by the $CO_2$ laser pulse, it interacts with a smooth molten layer of the material. The molten material lacks any cracks and loose particles that could produce micron size particulate ejection. Subsequently, the KrF laser pulse generates a plasma plume (150) as a result of the laser-target interaction. The plasma plume formed at the target surface will interact with the remaining part of the $CO_2$ laser pulse to heat the plume to a higher temperature that would reevaporate any submicron particles remaining in the plume. The resulting high energy plume will expand rapidly into the ambient spreading out as it propagates forward. The material in the plume is deposited on a substrate (160) placed a suitable distance in front of the target in the vacuum chamber.

Figure 2A:
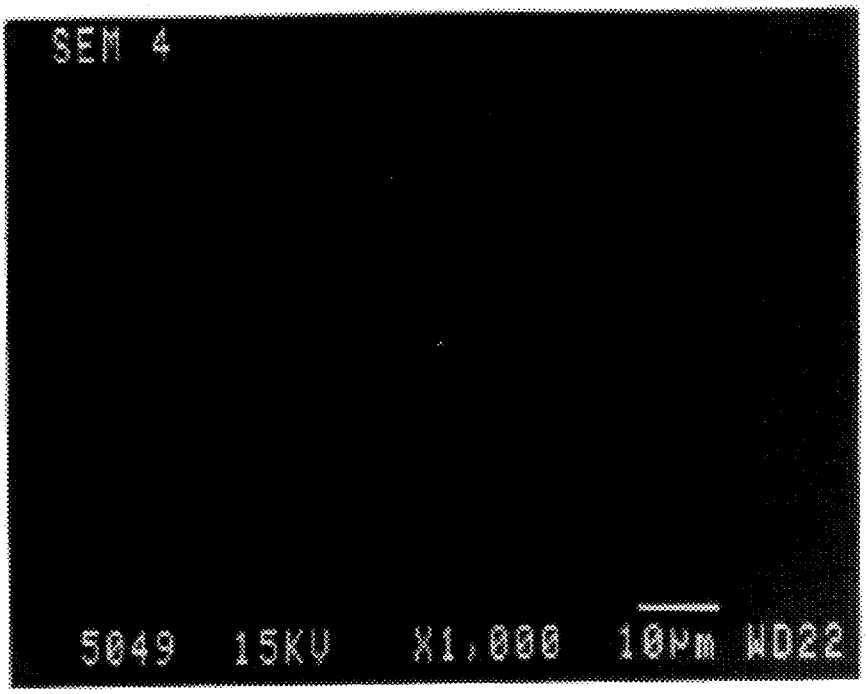
FIGS. 2(a) and 2(b) are of scanning electron micrographs of the films deposited with (a) present invention (b) single KrF laser.
Figure 2B:
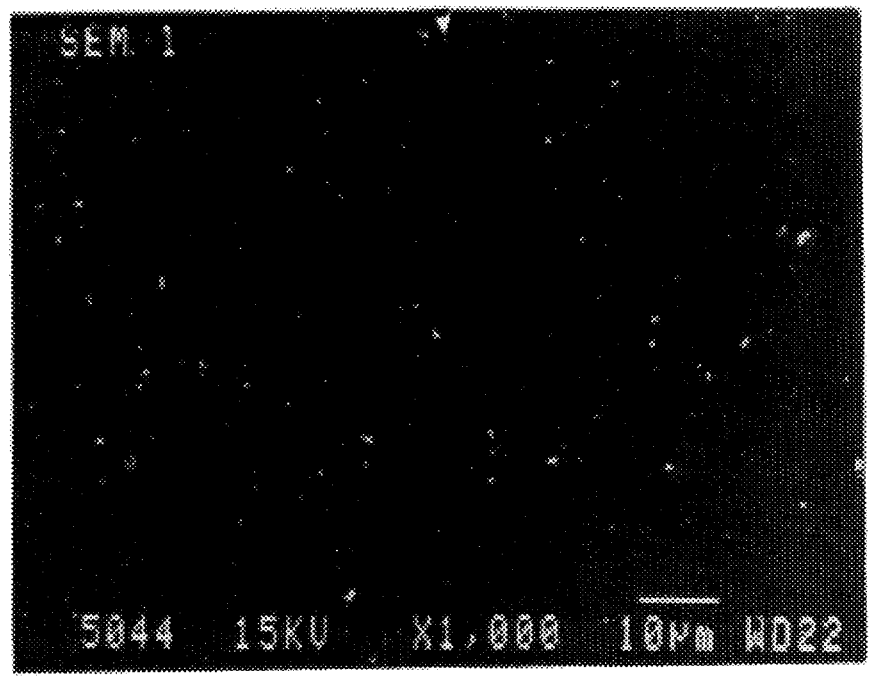

The method of the present invention has been used in depositing Yttria ($Y_2O_3$) films from a compact sintered powder target on a silicon (Si) substrate placed 6.25 cm in front of the target. The incident angles of the two lasers on the target were 45 degrees. The KrF and the $CO_2$ laser beams were spatially overlapped on an area of 9 mm$^2$ at the target. Moreover, the $CO_2$ laser beam was "completely overlapped" by the KrF laser beam at the target, in the sense that the area of the target upon which the $CO_2$ laser beam impinged was completely within the perimeter of the area of the target upon which the KrF laser beam impinged. The target was oriented substantially parallel to the substrate. Applicants' experiments under the above conditions showed the optimum inter-pulse-delay to be 50 ns after the onset of the $CO_2$ laser pulse. The films deposited with a subatmospheric 10 mTorr ambient oxygen pressure contained less than $10^3$ submicron particles per square centimeter. Single excimer laser deposited films with a similar thickness contain $10^6$–$10^7$ particles per square centimeter. For example, FIG. 2 illustrates the scanning electron micrographs of a film deposited using the method of the present invention and the foregoing deposition parameters (FIG. 2(a)), and a film of similar thickness deposited using single KrF laser ablation (FIG. 2(b)).

Figure 3A:
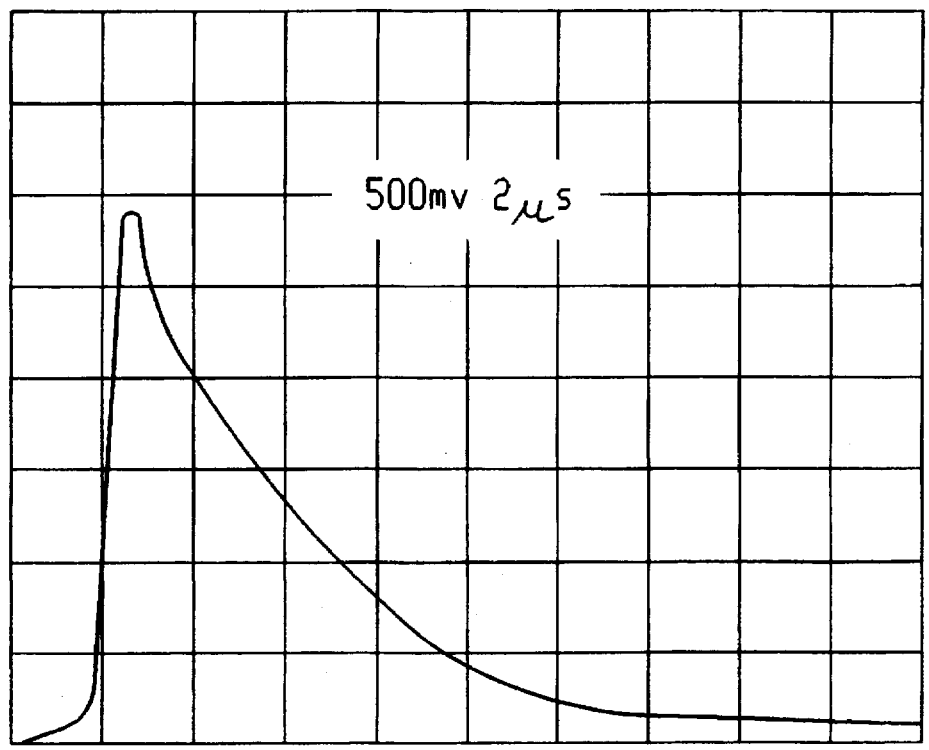
FIGS. 3(a) and 3(b) are of temporal ion probe results showing ionic enhancement of the plume with (a) present invention (b) single KrF laser.
Figure 3B:
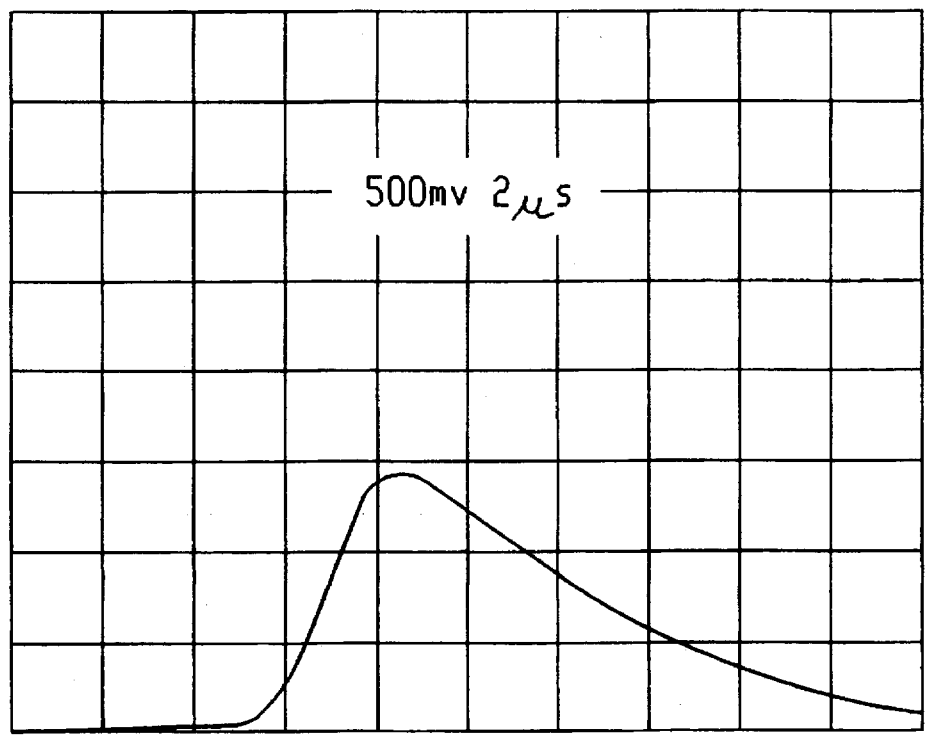

In addition to the significant reduction in particulate density, the high energy of the plume produced by the method of the present invention will increase its reactivity with ambient gases and improve the deposited film quality. The enhancement of the plume energy under the method of the present invention and the foregoing deposition parameters has been monitored by ion probe measurement. FIG. 3(a) shows the time variation of the ion signal from such a plume. The temporal ion probe signals indicate the time of arrival of the ions at the probe which is placed at a distance of 6.25 cm from the target on the axis of the plume. Earlier arrival times indicate larger velocities. In comparing FIG. 3(a) with the ion signal from a single KrF laser ablated plume in FIG. 3(b), a more than two fold increase in ion velocity is observed. This corresponds to a greater than four fold increase in the plume kinetic energy. Additionally, an increase in the ion signal height indicates enhanced ionization of the plume. Observation of the luminous plume during deposition as well as profilometer studies of the deposited film thickness indicate an enhancement in the area of uniform film growth.

Although the preferred embodiments of the invention have been described herein, those skilled in the art will recognize obvious variations, changes and substitutions that may be made without departing from the invention. Accordingly, it is intended that such changes and modifications be included in the present invention limited only by the scope of the appended claims.

We claim:

1. A method for depositing a film material onto a substrate using two pulsed lasers, comprising the steps of:
   placing a target of deposition material in a chamber,
   providing a gaseous atmosphere at a predetermined pressure within the chamber,
   providing a first pulsed laser and a second pulsed laser,
   focusing a first pulsed laser beam generated by the first pulsed laser and a second pulsed laser beam generated by the second pulsed laser at the target such that the first and second pulsed laser beams spatially overlap on the target and a predetermined time delay is provided between the first and second pulsed laser beams, thereby producing a plume of ablated deposition material, at least one of said laser beams also irradiating said plume, and
   collecting the ablated deposition material on a substrate suitably positioned to form a film deposit on the substrate.

2. A method as set forth in claim 1, wherein both the first and second pulsed laser beams have distinct wavelengths.

3. A method as set forth in claim 2, wherein the the focusing of the first and second pulsed laser beams at the target is at an angle of incidence on the target between ninety degrees and approaching zero degrees normal to the target.

4. A method as set forth in claim 3, wherein the pressure in the chamber is less than 1 atmosphere.

5. A method as set forth in claim 4, wherein the first pulsed laser beam impinges the target forming a smooth molten layer of deposition material at the target, and the second pulsed laser beam ablates the deposition material at the target.

6. A method as set forth in claim 5, wherein the first laser is a pulsed infrared laser and the second laser is a pulsed ultraviolet laser.

7. A method as set forth in claim 6, wherein the first laser is a pulsed $CO_2$ laser and the second laser is a pulsed ultraviolet laser of wavelength between 150 and 400 nm.

8. A method as set forth in claim 7, wherein the film deposit is an electronic material.

9. A method as set forth in claim 8, wherein the wavelengths and fluences of the first and second pulsed laser beams, the area of the target upon which the first and second pulsed laser beam spatially overlap, the predetermined time delay, the predetermined pressure within the chamber and the angles of incidence of the first and second pulsed laser beams on the target are selected to control the kinetic energy, volume and particulate density in the plume, thereby to control the the number of submicron particles per square centimeter in the deposit film on the substrate.

10. A method as set forth in claim 9, wherein the surface of the substrate is substantially parallel to the surface of the target.

11. A method as set forth in claim 9, wherein the target and the substrate are at room temperature.

12. A method as set forth in claim 7, wherein the film deposit is an optical material.

13. A method as set forth in claim 12, wherein the wavelengths and fluences of the first and second pulsed laser beams, the area of the target upon which the first and second pulsed laser beams spatially overlap, the predetermined time delay, the predetermined pressure within the chamber and the angles of incidence of the first and second pulsed laser beams on the target are selected to control the kinetic energy, volume and particulate density in the plume, thereby to control the the number of submicron particles per square centimeter in the deposit film on the substrate.

14. A method as set forth in claim 3, wherein the wavelengths and fluences of the first and second pulsed laser beams, the area of the target upon which the first and second pulsed laser beams spatially overlap, the predetermined time delay, the predetermined pressure within the chamber and the angles of incidence of the first and second pulsed laser beams on the target are selected to control the kinetic energy, volume and particulate density in the plume, thereby to control the number of submicron particles per square centimeter in the deposit film on the substrate.

15. A method for forming a film with reduced particulate density on a substrate by laser deposition, said process comprising irradiating the surface of a target deposition material with a first laser beam at a first wavelength, and irradiating said surface with a second laser beam at a second wavelength different from said first wavelength whereby a molten layer of target material is generated on said target surface and a plume of target material is generated from said molten layer, a portion of said first laser beam irradiating said plume whereby said plume of target material is a high energy plume,
   said substrate being positioned close enough to said target so that target material from said plume deposits on said substrate.

16. The process of claim 15, wherein the target material in said plume is heated by said first laser beam to temperature above its melting point whereby said target material is deposited onto said substrate with reduced particle density.

17. The process of claim 16, wherein said first and second laser beam are pulsed laser beams.

18. The process of claim 17, wherein the pulses of said first laser beam and the pulses of said second laser beam are synchronized such that there is a delay between the pulses of said first laser beam and respective pulses of said second laser beam.

19. The process of claim 18, wherein said target and said substrate are contained in a chamber maintained at a pressure of less than 1 atmosphere.

20. The process of claim 19, wherein the first laser is a pulsed infrared laser and the second laser is a pulsed ultraviolet laser.

21. The process of claim 20, wherein the first laser is a pulsed $CO_2$ laser and the second laser is a pulsed ultraviolet laser of wavelength between 150 and 400 nm.

22. The process of claim 21, wherein the deposited film is an electronic material.

23. The process of claim 21, wherein the deposited film is an optical material.

24. A process for forming a film with reduced particulate density on a substrate by pulse laser deposition, said process comprising
   irradiating the surface of a target deposition material with a first laser beam at a first wavelength to generate a molten layer of target material on said target surface,
   irradiating said molten layer with a second laser beam at a second wavelength different from said first wavelength to generate a plume of target material, the pulses of said second laser beam occurring at a time delay with respect to the pulses of said first laser beam, at least a portion of said first pulsed laser beam irradiating said plume so that target material in said plume is heated to a temperature above its melting point thereby forming a high energy plume, and
   collecting the target material in said high energy plume on said substrate to thereby form a film with reduced particulate density.

* * * * *